US012787417B2

(12) United States Patent
Liao et al.

(10) Patent No.: US 12,787,417 B2

(45) Date of Patent: Nov. 3, 2026

(54) INTEGRATED CIRCUIT PACKAGES AND METHODS

(71) Applicant: Taiwan Semiconductor Manufacturing Co., Ltd., Hsinchu (TW)

(72) Inventors: Jen-Chun Liao, Taipei City (TW); Yen-Hung Chen, Hsinchu (TW); Ching-Hua Hsieh, Hsinchu (TW); Sung-Yueh Wu, Chiayi County (TW); Chih-Wei Lin, Zhubei City (TW); Kung-Chen Yeh, Taichung City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 783 days.

(21) Appl. No.: 18/151,643

(22) Filed: Jan. 9, 2023

(65) Prior Publication Data

US 2024/0234210 A1 Jul. 11, 2024

(51) Int. Cl.

| | |
|---|---|
| ***H10D 84/03*** | (2025.01) |
| ***H10P 50/24*** | (2026.01) |
| ***H10W 74/01*** | (2026.01) |
| ***H10W 74/10*** | (2026.01) |
| ***H10W 90/00*** | (2026.01) |
| *H10W 72/00* | (2026.01) |
| *H10W 72/90* | (2026.01) |

(Continued)

(52) U.S. Cl.

CPC ......... *H10D 84/038* (2025.01); *H10P 50/242* (2026.01); *H10W 74/01* (2026.01); *H10W 74/114* (2026.01); *H10W 90/00* (2026.01); *H10W 72/0198* (2026.01); *H10W 72/934* (2026.01); *H10W 74/15* (2026.01); *H10W 80/312* (2026.01); *H10W 80/327* (2026.01); *H10W 80/732* (2026.01); *H10W 90/724* (2026.01); *H10W 90/734* (2026.01); *H10W 90/792* (2026.01)

(58) Field of Classification Search

CPC .... H10D 84/038; H10P 50/242; H10W 90/00; H10W 80/312; H10W 80/327

See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |

(Continued)

*Primary Examiner* — Nicholas J Tobergte

(74) *Attorney, Agent, or Firm* — Slater Matsil, LLP

(57) ABSTRACT

An integrated circuit package including integrated circuit dies and a method of forming are provided. The integrated circuit package may include a first integrated circuit die and a second integrated circuit die bonded to the first integrated circuit die. The first integrated circuit die may include a first substrate, a first interconnect structure, and a first bonding layer. The first interconnect structure may be between the first bonding layer and the first substrate. The second integrated circuit die may include a second substrate, a second interconnect structure, and a second bonding layer. The second interconnect structure may be between the second bonding layer and the second substrate. A first surface of the first bonding layer may be in direct contact with a first surface of the second bonding layer. A sidewall the first bonding layer and the first surface of the second bonding layer may form a first acute angle.

20 Claims, 19 Drawing Sheets

202

(51) Int. Cl.

| | |
|---|---|
| *H10W 74/15* | (2026.01) |
| *H10W 80/00* | (2026.01) |

(56) References Cited

U.S. PATENT DOCUMENTS

| | | | | |
|---|---|---|---|---|
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 2018/0350778 | A1 | 12/2018 | Yu et al. | |
| 2020/0135564 | A1 | 4/2020 | Zundel et al. | |
| 2022/0367407 | A1* | 11/2022 | Lin | H01L 25/0657 |
| 2023/0411326 | A1* | 12/2023 | Tsai | H01L 24/08 |

* cited by examiner

INTEGRATED CIRCUIT PACKAGES AND METHODS

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
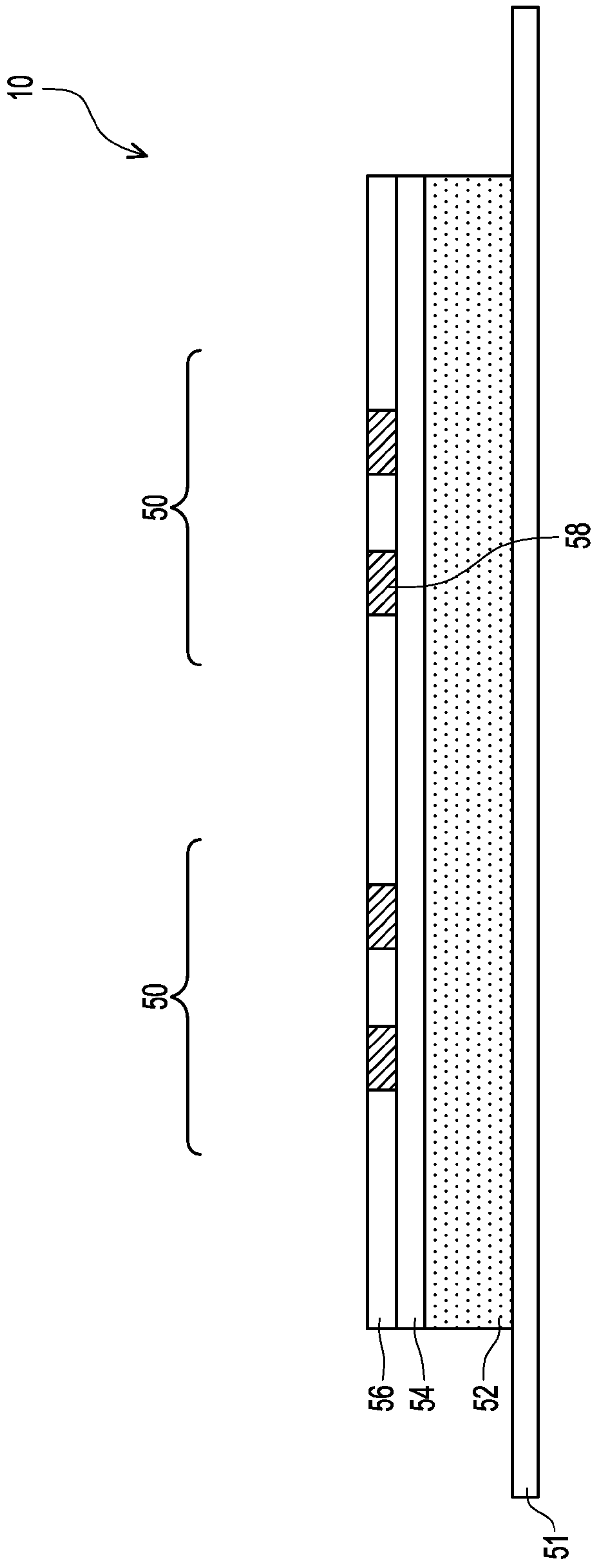
FIGS. 1, 2, 3, 4, 5, 6, 7, 8A, 8B, 9, 10, 11, 12, 13, 14A, 14B, 15A, 15B, and 16 illustrate cross-sectional views of intermediate stages in the manufacturing of an integrated circuit package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit package including integrated circuit dies singulated using laser ablation and plasma etching techniques, and the method of forming the same are provided. In accordance with some embodiments, an integrated circuit package comprises integrated circuit dies, which may be singulated from a wafer by a singulation method including a laser ablation process followed by a plasma etching process. The plasma etching process may be an anisotropic plasma etching or an isotropic plasma etching. Such a singulation method may lead to a more effective bonding between the singulated integrated circuit dies and another integrated circuit die. As a result, defects at the bonding interface are reduced or prevented, thereby leading to an improved reliability of the integrated circuit package.

FIGS. 1 through 6 are views of intermediate stages in the manufacturing of top integrated circuit dies 50, in accordance with some embodiments. Referring first to FIG. 1, a cross-sectional view of a wafer 10 is illustrated. The wafer 10 is supported by a tape 51. The wafer 10 comprises top integrated circuit dies 50, and the wafer 10 may be subsequently singulated as described below to form discrete top integrated circuit dies 50. Each of the top integrated circuit dies 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. The top integrated circuit dies 50 may be the same or different.

The wafer 10 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 may have an active surface (e.g., the surface facing upwards in FIG. 1), sometimes called a front side, and an inactive surface (e.g., the surface facing downwards in FIG. 1), sometimes called a back side.

Devices (not separately illustrated) may be disposed at the active surface of the semiconductor substrate 52. The devices may be active devices (e.g., transistors, diodes, etc.) or passive devices (e.g., capacitors, resistors, etc.). An interconnect structure 54 is disposed over the active surface of the semiconductor substrate 52. The interconnect structure 54 may interconnect the devices to form an integrated circuit. The interconnect structure 54 may be formed of, for example, metallization patterns (not separately shown) in dielectric layers (not separately shown). The dielectric layers may be, e.g., low-k dielectric layers. The metallization patterns may include metal lines and vias, which may be formed in the dielectric layers by a damascene process, such as a single damascene process, a dual damascene process, or the like. The metallization patterns may be formed of a suitable conductive material, such as copper, tungsten, aluminum, silver, gold, a combination thereof, or the like. The metallization patterns may be electrically coupled to the devices.

A bonding layer 56 is over the interconnect structure 54, at the front side of the top integrated circuit dies 50. The bonding layer 56 may be formed of an oxide such as silicon oxide, phosphosilicate glass (PSG), borosilicate glass (BSG), boron-doped phosphosilicate glass (BPSG), a tetraethyl orthosilicate (TEOS) based oxide, or the like; a nitride such as silicon nitride or the like; a combination thereof; or the like. The bonding layer 56 may be formed, for example, by chemical vapor deposition (CVD), atomic layer deposition (ALD), spin coating, lamination, or the like. One or more passivation layer(s) (not separately illustrated) may be disposed between the bonding layer 56 and the interconnect structure 54.

Die connectors 58 extend through the bonding layer 56. The die connectors 58 may include conductive pillars, pads, or the like, to which external connections may be made. In some embodiments, the die connectors 58 include bond pads (not separately illustrated) at the front side of the top integrated circuit die 50, and bond pad vias (not separately illustrated) that connect the bond pads to the upper metallization pattern of the interconnect structure 54. In such embodiments, the die connectors 58, including the bond pads and the bond pad vias, may be formed by a damascene process, such as a single damascene process, a dual damascene process, or the like. The die connectors 58 may be formed of a conductive material, such as a metal, such as copper, aluminum, or the like, by a technique, such as plating or the like. In some embodiments, a planarization process such as a CMP, a grinding process, an etch-back process, combinations thereof, or the like, is performed on the bonding layer 56 and the die connectors 58. After the planarization process, surfaces of the bonding layer 56 and the die connectors 58 may be substantially coplanar (within process variations).

Figure 2:
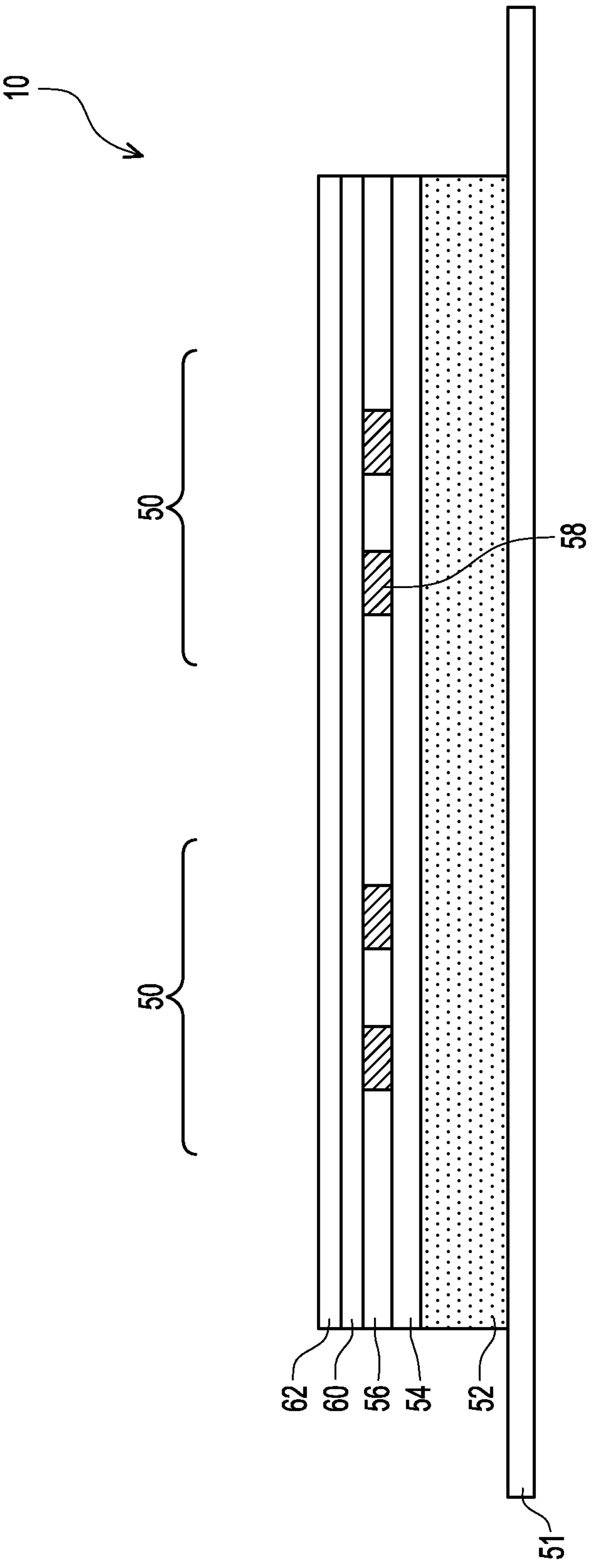

In FIG. 2, a first protective layer 60 is formed on the wafer 10, such as on the bonding layer 56 and the die connectors 58, and a second protective layer 62 is formed on the first protective layer 60. The first protective layer 60 and the second protective layer 62 may protect the underlying top integrated circuit dies 50 during the subsequent singulation processes. In some embodiments, the first protective layer 60 is formed of a dielectric material, such as silicon oxide, silicon nitride, silicon oxynitride, silicon oxycarbide, or the like by a technique, such as CVD, ALD, or the like. In some embodiments, the first protective layer 60 is formed of a non-water-soluble polymer, by a technique, such as spin coating, or the like. The first protective layer 60 may have a thickness in a range from about 0.02 μm to about 2 μm, such as about 0.05 μm. The second protective layer 62 may be formed of a water-soluble polymer, such as polyvinylpyrrolidone (PVP), polyvinyl alcohol (PVA), or the like, by a technique, such as spin coating, or the like. The second protective layer 62 may have a thickness in a range from about 0.5 μm to about 10 μm, such as about 5 μm.

FIG. 3 through 6 are views of intermediate stages in a singulation process which singulates the wafer 10 into discrete top integrated circuit dies 50. The singulation method utilized during the singulation process may include a laser ablation process followed by a plasma etching process. Such a singulation method may lead to a more effective subsequent bonding process where top integrated circuit dies 50 are bonded to another integrated circuit die. As a result, defects at the bonding interface are reduced or prevented, thereby leading to an improved reliability of the integrated circuit package.

Figure 3:
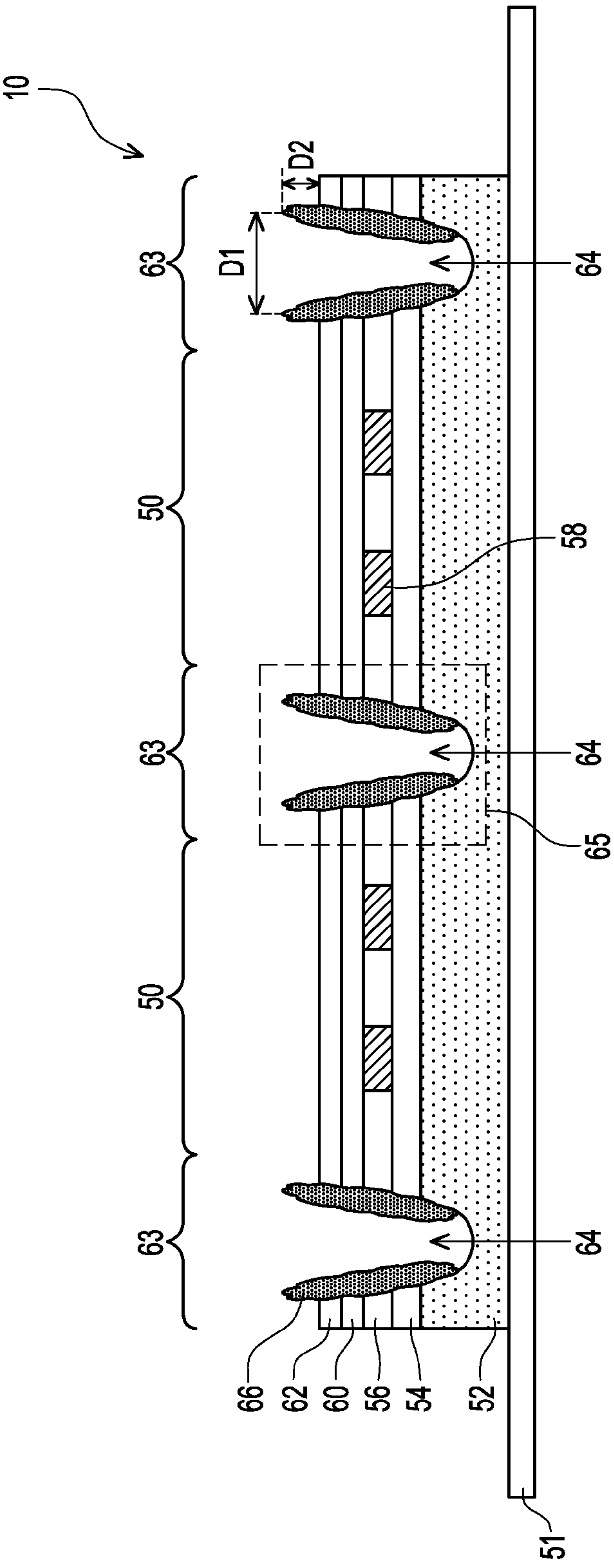

Referring to FIG. 3, a first dicing process where a laser ablation process is applied to the wafer 10 in scribe line regions 63. The laser ablation process may form grooves 64 that extend through the second protective layer 62, the first protective layer 60, the bonding layer 56, the interconnect structure 54, and into the semiconductor substrates 52. The grooves 64 may not extend fully through the semiconductor substrates 52, and may expose a surface of the semiconductor substrates 52. Recast regions 66 may be formed on sidewalls of the grooves 64, such as sidewalls of the second protective layer 62, the first protective layer 60, the bonding layer 56, the interconnect structure 54, and the semiconductor substrate 52 during the laser ablation process. The recast regions 66 may be formed as a result of re-deposition of materials of the second protective layer 62, the first protective layer 60, the bonding layer 56, the interconnect structure 54, and the semiconductor substrate 52 removed by laser beams during the laser ablation process. As a result, the recast regions 66 may comprise chemical elements (e.g., silicon) of the second protective layer 62, the first protective layer 60, the bonding layer 56, the interconnect structure 54, and the semiconductor substrate 52. The recast regions 66 may be on opposing sidewalls of the groove 64 may extend above a top surface of the bonding layer 56 and protrude from a top surface of the second protective layer 62. In some embodiments, the laser ablation process removes portions of the second protective layer 62 and the first protective layer 60 along the grooves 64 and exposes portions of the top surface of the bonding layer 56 along the grooves 64.

The laser ablation process may include applying one or more laser beams to the second protective layer 62, the first protective layer 60, the bonding layer 56, the interconnect structure 54, and into the semiconductor substrates 52. A position, power, number of, and/or type of each laser beam are controlled in order to achieve a desired profile of the resulting groove 64. The power of the laser beams may be in a range between 1 W and 10 W, such as about 5 W.

In the embodiment illustrated in FIG. 3, a horizontal distance D1 between the highest points (e.g., furthest from the top surface of the second protective layer 62) of the recast regions 66 may be in a range between about 50 μm and about 200 μm, such as about 150 μm. A vertical distance D2 between the highest point of each recast region 66 and the top surface of the second protective layer 62 may be in a range between 0 μm and about 20 μm, such as about 15 μm. The recast regions 66 are illustrated as being symmetrical (e.g., having a same shape on opposing sidewalls of the groove 64) as an example. The recast regions 66 may have different profiles on each sidewall of each groove 64. The shape and location of the recast regions 66 illustrated in FIG. 3 is an example, other shapes and locations of the recast regions 66 are contemplated.

Figure 4:
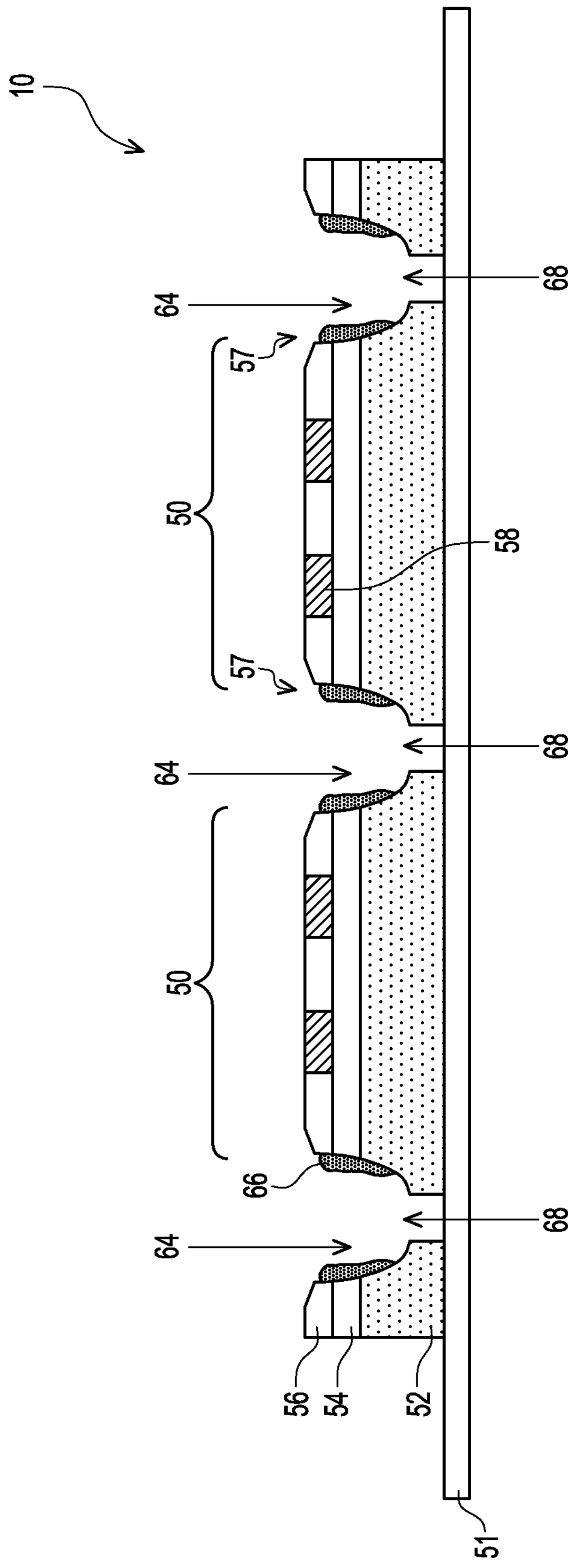

In FIG. 4, a removal process is applied to the wafer 10 to remove at least portions of the recast regions 66 in order to provide a flatter surface with fewer protrusions such that a subsequent bonding process can be performed more effectively with little or no hindrance from the recast regions 66. In the embodiment illustrated in FIG. 4, the removal process includes an anisotropic plasma etching to partially remove the recast regions 66 and to recess upper surfaces of the recast regions 66 to below the top surface of the bonding layer 56, thereby allowing a subsequent bonding process where the top surface of the bonding layer 56 is bonded another surface to be performed more effectively with little or no hindrance from the recast regions 66. The remaining portions of the recast regions 66 may be on sidewalls of the bonding layer 56, the interconnect structure 54, and the semiconductor substrate 52.

In some embodiments, upper corners or edges of the bonding layer 56 are removed, thereby forming chamfered or rounded corners 57. The first dicing process, such as the laser ablation process discussed above, may expose portions of the top surface of the bonding layer 56 along the grooves 64. Additionally, as the anisotropic plasma etching removes the recast regions 66, the anisotropic plasma etching may also may remove portions of the bonding layer 56 along the grooves 64. The removal of the bonding layer 56 may be at a slower rate than the removal of the recast regions 66, which may lead to chamfered or rounded corners 57 on the bonding layer 56 along the grooves 64.

The plasma used for the anisotropic plasma etching process may be a fluorine-based plasma, a chlorine-based plasma, or the like, which may be generated by a gas source including an etchant and a carrier gas. Acceptable fluorine-based etchants may include carbon tetrafluoride (CF), octafluorocyclobutane (CF), sulfur hexafluoride ($SF_6$), or the like. Acceptable chlorine-based etchants may include chlorine ($Cl_2$), carbon tetrachloride ($CCl_4$), or the like. The carrier gas may be an inert gas such as Ar, He, Xe, Ne, Kr, Rn, the like, or combinations thereof. In some embodiments, the plasma is generated by a radio frequency (RF) plasma generator, or the like, with a generation power in a range from about 0.3 kW to about 1 kW, such as about 0.5 kW. In some embodiments, the plasma may be generated by a microwave plasma generator, or the like, with a generation power in a range from about 0.5 kW to about 1.5 kW, such as about 1 kW.

FIG. 4 further illustrates the removal of the second protective layer 62 and the first protective layer 60, and the formation of openings 68 through the semiconductor substrate 52 by a second dicing process. In embodiments in which the second protective layer 62 is water soluble, the second protective layer 62 may be removed by water. The second dicing process is applied to form openings 68 through the semiconductor substrate 52 and to singulate the wafer 10 into discrete structures. In some embodiments, the openings 68 are formed by blade dicing or the like, which utilizes an abrasive disc or blade rotating at a high speed. In some embodiments, the openings 68 are formed by stealth dicing, which utilizes a laser beam, such as an infrared laser beam. The width of the openings 68 formed by blade dicing may be larger than the width of the openings 68 formed by stealth dicing. In some embodiments, the first protective layer 60 are removed by a suitable process, such as wet etching, dry etching, or ashing. In some embodiments, the first protective layer 60 is removed after the second dicing process to provide a protection to the bonding layer 56 during the second dicing process.

Figure 5:
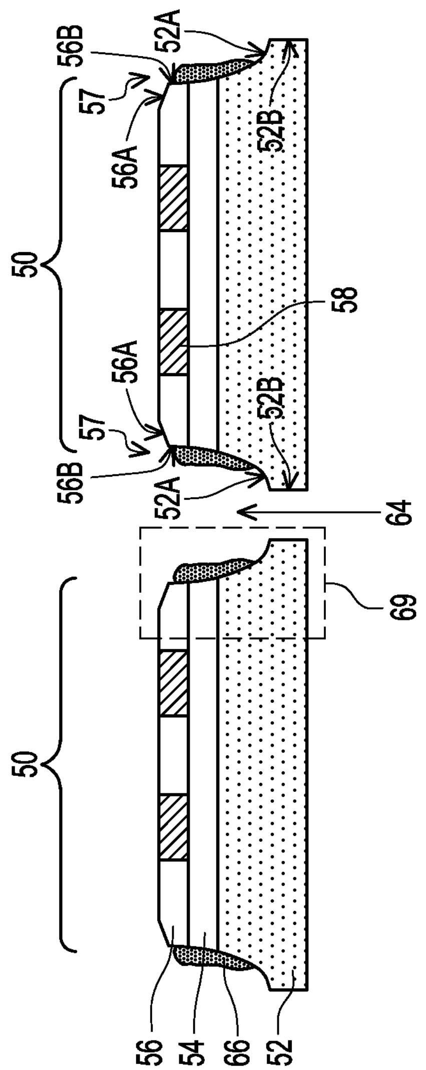
Figure 6:
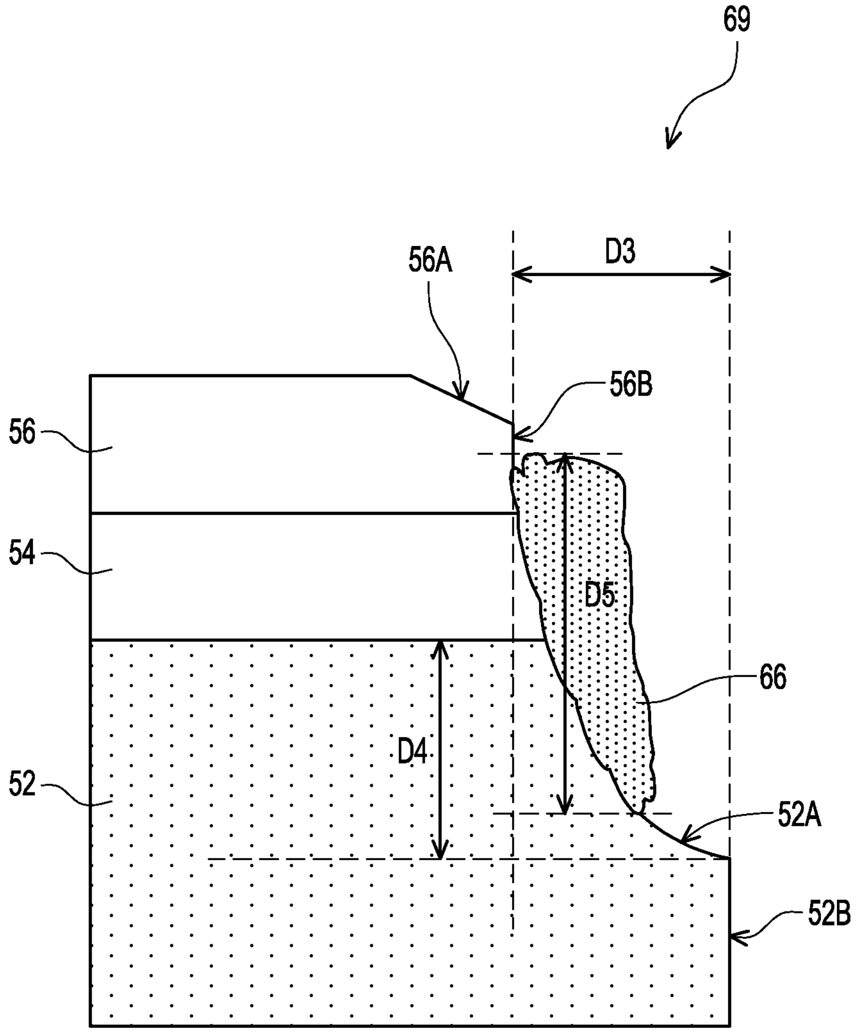

In FIG. 5, the top integrated circuit dies 50 are removed from the tape 51, wherein FIG. 6 shows an enlarged view of a region 69 of the top integrated circuit die 50 shown in FIG. 5 in accordance with some embodiments. As discussed above, the bonding layer 56 may have chamfered or rounded corners 57 along the grooves 64. Sidewalls of the bonding layer 56 may have upper sidewalls 56A and lower sidewalls 56B, wherein the upper sidewalls 56A may be exposed and the lower sidewalls 56B may be at least partially covered by the recast regions 66. The upper sidewalls 56A may be slanted and the lower sidewalls 56B may be substantially vertical. The recast regions 66 may completely cover sidewalls of the interconnect structures 54. Upper portions of the semiconductor substrates 52 (e.g., portions of semiconductor substrates 52 near the interconnect structures 54) may have upper sidewalls 52A, which may be curved as a result of first dicing process and/or the plasma etching process. Lower portions of the semiconductor substrates 52 (e.g., distal portions of semiconductor substrates 52 from the interconnect structures 54) may have lower sidewalls 52B, which may be substantially straight as a result of the second dicing process. The recast regions 66 may partially cover the upper sidewalls 52A and the lower portions of the semiconductor substrates 52 may laterally extend beyond the recast regions 66.

Referring to FIG. 6, a horizontal distance D3 between the lower sidewall 56B of the bonding layer 56 and the lower sidewall 52B of the semiconductor substrate 52 may be in a range between about 2 μm to about 80 μm, such as about 40 μm. A vertical distance D4 between a top point and a bottom point of the upper sidewall 52A of the semiconductor substrate 52 (e.g., a thickness of the upper portion of the semiconductor substrate 52) may be in a range between about 1 μm to about 20 μm, such as about 10 μm. The recast region 66 may have a height D5 in the vertical direction in a range between about 10 μm to about 50 μm, such as about 30 μm, and a width in the horizontal direction in a range between about 1 μm to about 10 μm, such as about 5 μm.

Figure 7:
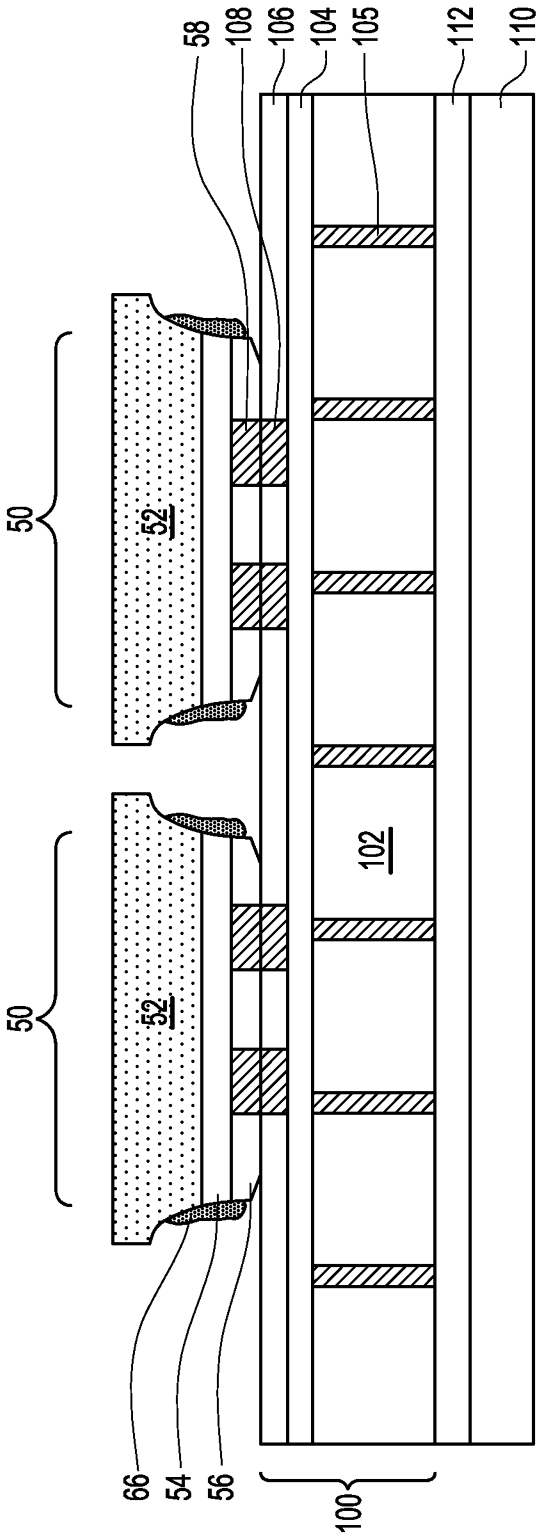

FIGS. 7 through 12 are views of intermediate stages in the manufacturing of an integrated circuit package 200 (see FIG. 12), in accordance with some embodiments. Referring to FIG. 7, top integrated circuit dies 50 (shown in e.g., FIG. 5) are bonded to a bottom integrated circuit die 100. In the embodiment illustrated in FIG. 7, two top integrated circuit dies 50 are bonded to the bottom integrated circuit die 100 is shown as an example, other layouts are contemplated.

The bottom integrated circuit die 100 may be a logic die (e.g., CPU, GPU, SoC, AP, microcontroller, etc.), a memory die (e.g., DRAM die, SRAM die, etc.), a power management die (e.g., PMIC die), a RF die, a sensor die, a MEMS die, a signal processing die (e.g., DSP die), a front-end die (e.g., AFE die), the like, or combinations thereof. The materials and manufacturing processes of the features in bottom integrated circuit die 100 may be the same or similar to the like features in the top integrated circuit dies 50.

The bottom integrated circuit die 100 may include a semiconductor substrate 102, which may have an active surface (e.g., the surface facing upwards in FIG. 7), which may be called a front side, and an inactive surface (e.g., the surface facing downwards in FIG. 7), which may be called a back side. Devices (not separately illustrated) may be disposed at the active surface of the semiconductor substrate 102. The devices may be active devices (e.g., transistors, diodes, etc.) capacitors, resistors, or the like. An interconnect structure 104 may be disposed on the active surface of the semiconductor substrate 102.

Conductive vias 105 may be disposed in the semiconductor substrate 102. The conductive vias 105 may be electrically coupled to the metallization patterns of the interconnect structure 104. The conductive vias 105 may be through-substrate vias (TSV), such as through-silicon vias. In some embodiments, the conductive vias 105 may be formed by a via-first process, such that the conductive vias 105 may extend into the semiconductor substrate 102 but not the interconnect structure 104. The conductive vias 105 formed by a via-first process may be connected to a lower metallization pattern (e.g., closer to the semiconductor substrate 102) of the interconnect structure 104. In some embodiments, the conductive vias 105 may be formed by a via-middle process, such that the conductive vias 105 may extend through a portion of the interconnect structure 104 and into the semiconductor substrate 102. The conductive vias 105 formed by a via-middle process may be connected to a middle metallization pattern of the interconnect structure 104. In some embodiments, the conductive vias 105 may be formed by a via-last process, such that the conductive vias 105 may extend through an entirety of the interconnect structure 104 and into the semiconductor substrate 102. The conductive vias 105 formed by a via-last process may be connected to an upper metallization pattern (e.g., further from the semiconductor substrate 102) of the interconnect structure 104.

A bonding layer 106 may be disposed on the interconnect structure 104, at the front side of the bottom integrated circuit die 100. One or more passivation layer(s) (not separately illustrated) may be disposed between the bonding layer 106 and the interconnect structure 104. Die connectors 108 may extend through the bonding layer 106 may be electrically coupled to the metallization patterns of the interconnect structure 104 and/or the conductive vias 105.

The bottom integrated circuit die 100 may be attached to a carrier 110 by an adhesive 112 on the inactive surface of the semiconductor substrate 102. The carrier 110 may be a semiconductor carrier, a glass carrier, a ceramic carrier, or the like. The carrier 110 may be a wafer. In some embodiments, the adhesive 112 is a thermal-release layer, such as an epoxy-based light-to-heat-conversion (LTHC) release material, which loses its adhesive property when heated. In some embodiments, the adhesive 112 is a UV glue, which loses its adhesive property when exposed to UV light.

Still referring to FIG. 7, the top integrated circuit dies 50 may be bonded to the bottom integrated circuit die 100 by placing the top integrated circuit dies 50 using a pick-and-place process or the like, then bonding the bonding layers 56 and the die connectors 58 of the top integrated circuit dies 50 to the bonding layer 106 and the die connectors 108 of the bottom integrated circuit die 100, respectively. The bonding layers 56 may be directly bonded to the bonding layer 106 through dielectric-to-dielectric bonding, and the die connectors 58 may be directly bonded to respective die connectors 108 through metal-to-metal bonding. The bonding may include a pre-bonding and an annealing. During the pre-bonding, a small pressing force may be applied to press the top integrated circuit dies 50 against the bottom integrated circuit die 100. The pre-bonding may be performed at a low temperature, such as room temperature. After the pre-bonding, the bonding layers 56 of the top integrated circuit dies 50 may be bonded to the bonding layer 106 of the bottom integrated circuit die 100. The bonding strength may be then improved in a subsequent annealing step at a higher temperature. After the annealing, direct bonds such as dielectric-to-dielectric bonds may be formed, bonding the bonding layers 56 to the bonding layer 106. The die connectors 58 may be bonded to the die connectors 108 with a one-to-one correspondence. The die connectors 58 may be in physical contact with the die connectors 108 after the pre-bonding, or may expand to be brought into physical contact with the die connectors 108 during the annealing. Further, during the annealing, the material of the die connectors 58 may intermingle or bond with the material of the die connectors 108, so that metal-to-metal bonds may be formed.

FIG. 7 illustrates a front-to-front bonding configuration as an example, wherein the front sides of the top integrated circuit dies 50 face the front sides of the bottom integrated circuit die 100 after bonding. Other bonding configurations may be used, such as a front-to-back bonding configuration. In the front-to-back bonding configuration the front sides of the top integrated circuit dies 50 may face the front sides of the bottom integrated circuit die 100.

Figure 8A:
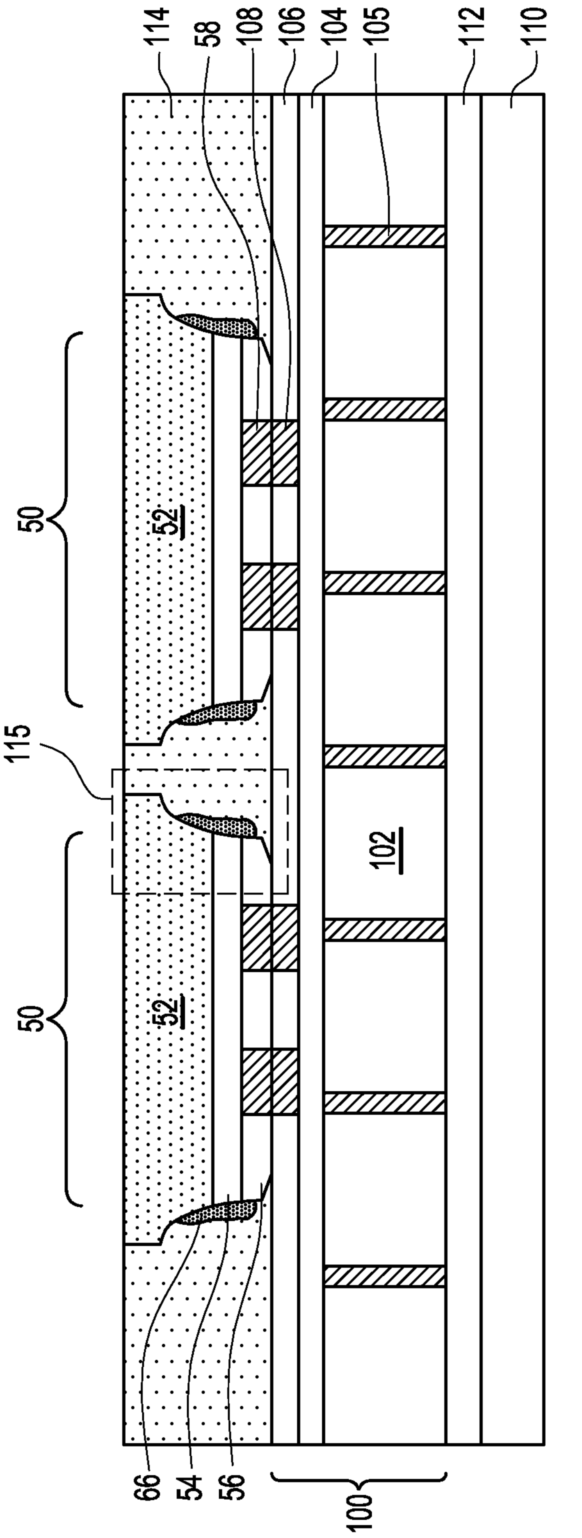
Figure 8B:
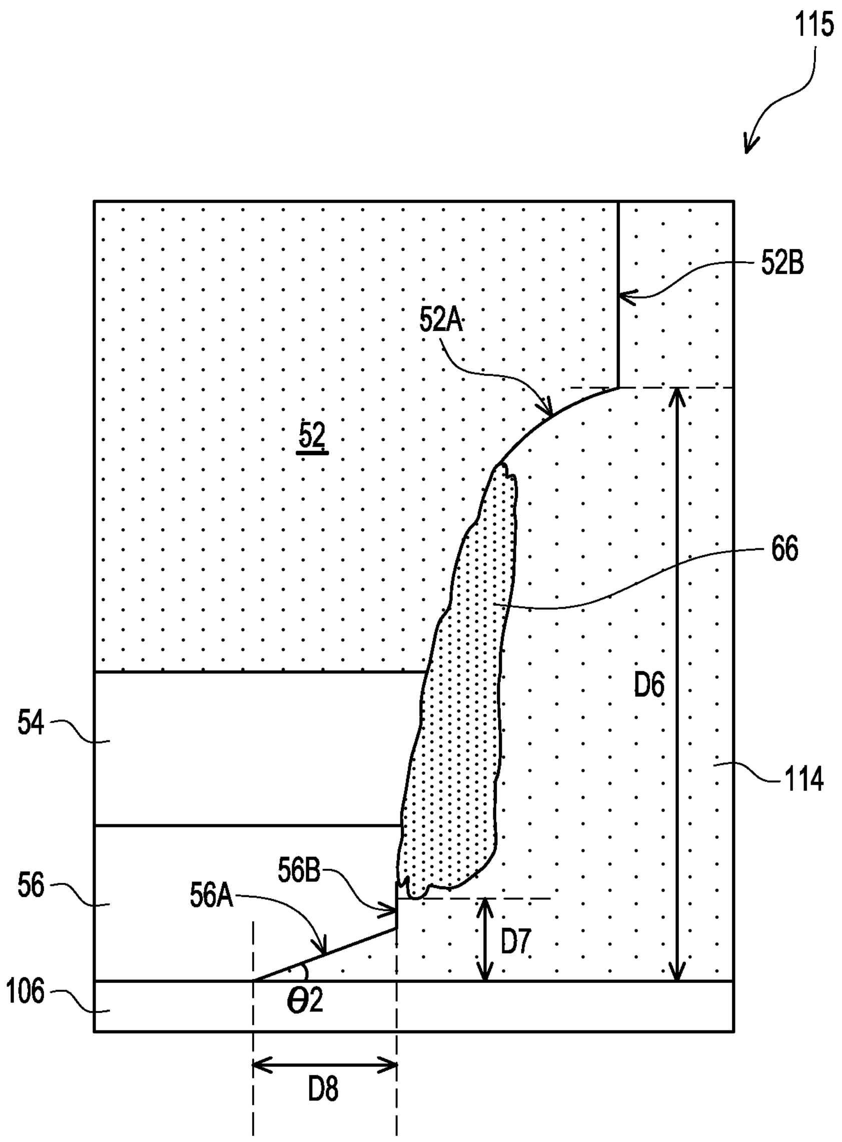

In FIG. 8A, a gap-fill layer 114 is formed over the bottom integrated circuit die 100 and around the top integrated circuit dies 50. The gap-fill layer 114 may be an insulating layer, wherein FIG. 8B shows an enlarged view of a region 115 of the structure shown in FIG. 8A top integrated circuit die 50 in accordance with some embodiments. In some embodiments, the gap-fill layer 114 comprises a molding compound, such as an epoxy, a resin, or the like, and is formed by compression molding, transfer molding, or the like. In some embodiments, the gap-fill layer 114 comprises a dielectric material, such as silicon oxide, PSG, BSG, BPSG, a TEOS based oxide, or the like, and is formed by a suitable deposition process such as CVD, ALD, or the like. Initially, the gap-fill layer 114 may cover the back sides of the top integrated circuit dies 50. A thinning process may be performed to remove portions of the gap-fill layer 114 to expose the semiconductor substrates 52. Portions of the semiconductor substrates 52 may be removed during the thinning process. The thinning process may be, a chemical-mechanical polishing (CMP) process, a grinding process, an etch-back process, combinations thereof, or the like. After the thinning process, surfaces of the gap-fill layer 114 and the top integrated circuit dies 50 (including the semiconductor substrates 52) are substantially coplanar (within process variations).

Referring to FIG. 8B, the lower portions of the semiconductor substrates 52 (e.g., distal portions of semiconductor substrates 52 from the interconnect structures 54) may overhang the interconnect structures 54 and the bonding layers 56. A vertical distance D6 between the bottom point of the upper sidewall 52A of the semiconductor substrate 52 and a top surface of the bonding layer 106 of the bottom integrated circuit die 100 may be in a range between about 5 μm to about 40 μm, such as 20 μm. The recast region 66 may be spaced apart from the top surface of the bonding layer 106 of the bottom integrated circuit die 100 by a distance D7 in a range between about 1 μm to about 20 μm, such as 10 μm. An intersection of the upper sidewall 56A of the bonding layer 56 and the top surface of the bonding layer 106 of the bottom integrated circuit die 100 may form an acute angle θ2 in a range between 0° to about 30°, such as about 15°. The space (e.g., recess) between the upper sidewall 56A and the top surface of the bonding layer 106 of the bottom integrated circuit die 100 may be filled with the gap-fill layer 114. The portion of the gap-fill layer 114 that extends between the upper sidewall 56A and the top surface of the bonding layer 106 may have a width D8 in the horizontal direction in a range between about 1 μm to about 15 μm, such as about 8 μm.

Figure 9:
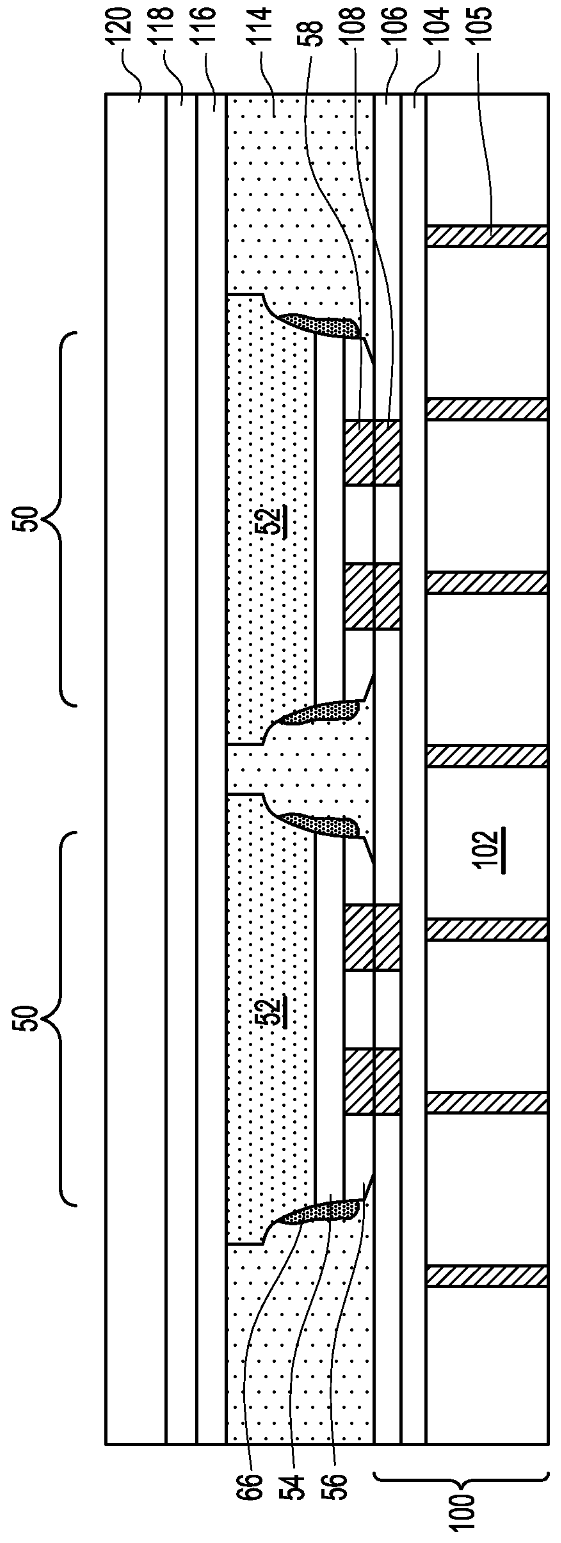

In FIG. 9, a carrier 120 is bonded to the upper surfaces of the semiconductor substrates 52 and the gap-fill layer 114, and the carrier 110 and the adhesive 112 are removed. The carrier 120 may be a semiconductor carrier, a glass carrier, a ceramic carrier, or the like. The carrier 120 may be a wafer having a same or similar size as the carrier 110 (shown in FIG. 8). In some embodiments, the carrier 120 is bonded to the semiconductor substrates 52 and the gap-fill layer 114 using bonding layers 116 and 118. The bonding layer 116 is formed on the semiconductor substrates 52 and the gap-fill layer 114, and the bonding layer 118 is formed on the carrier 120. The bonding layer 116 and the bonding layer 118 may each comprise a dielectric material, such as silicon dioxide or the like, and may be formed by a suitable deposition process such as CVD, ALD, or the like. The structure over the carrier 110 may be bonded to the carrier 120 by bonding the bonding layer 116 on the semiconductor substrates 52 and the bonding layer 118 on the carrier 120 by a same or similar process used for bonding the bonding layers 56 of the top integrated circuit dies 50 and the bonding layer 106 of the bottom integrated circuit die 100 described with respect to FIG. 7. The removal of the carrier 110 and the adhesive 112 may include projecting a light beam such as a laser beam or a UV light beam on the adhesive 112 (shown in FIG. 8)

so that the adhesive 112 decomposes upon exposure to the light beam and the carrier 110 may be removed.

Figure 10:
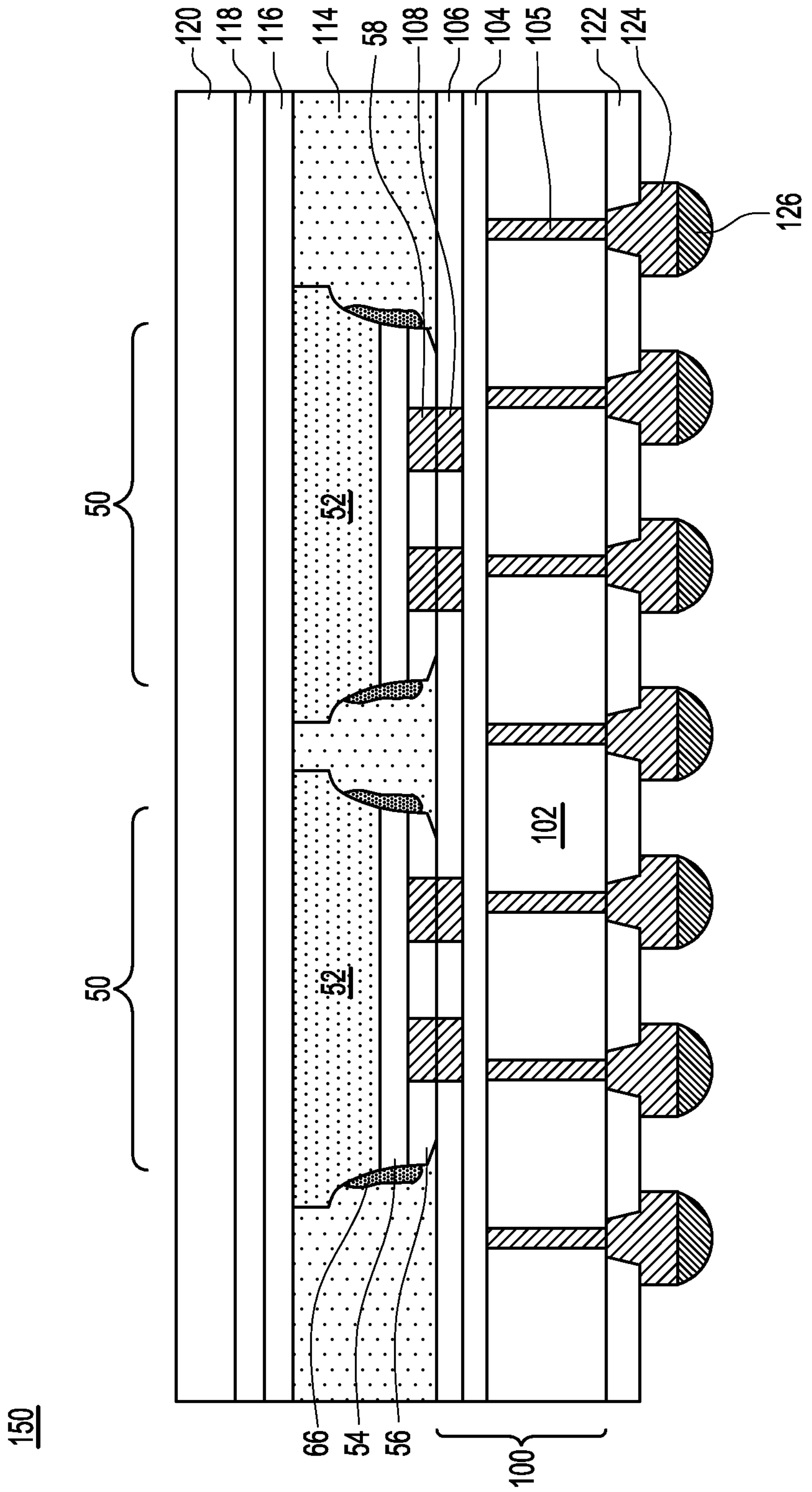
Figure 11:
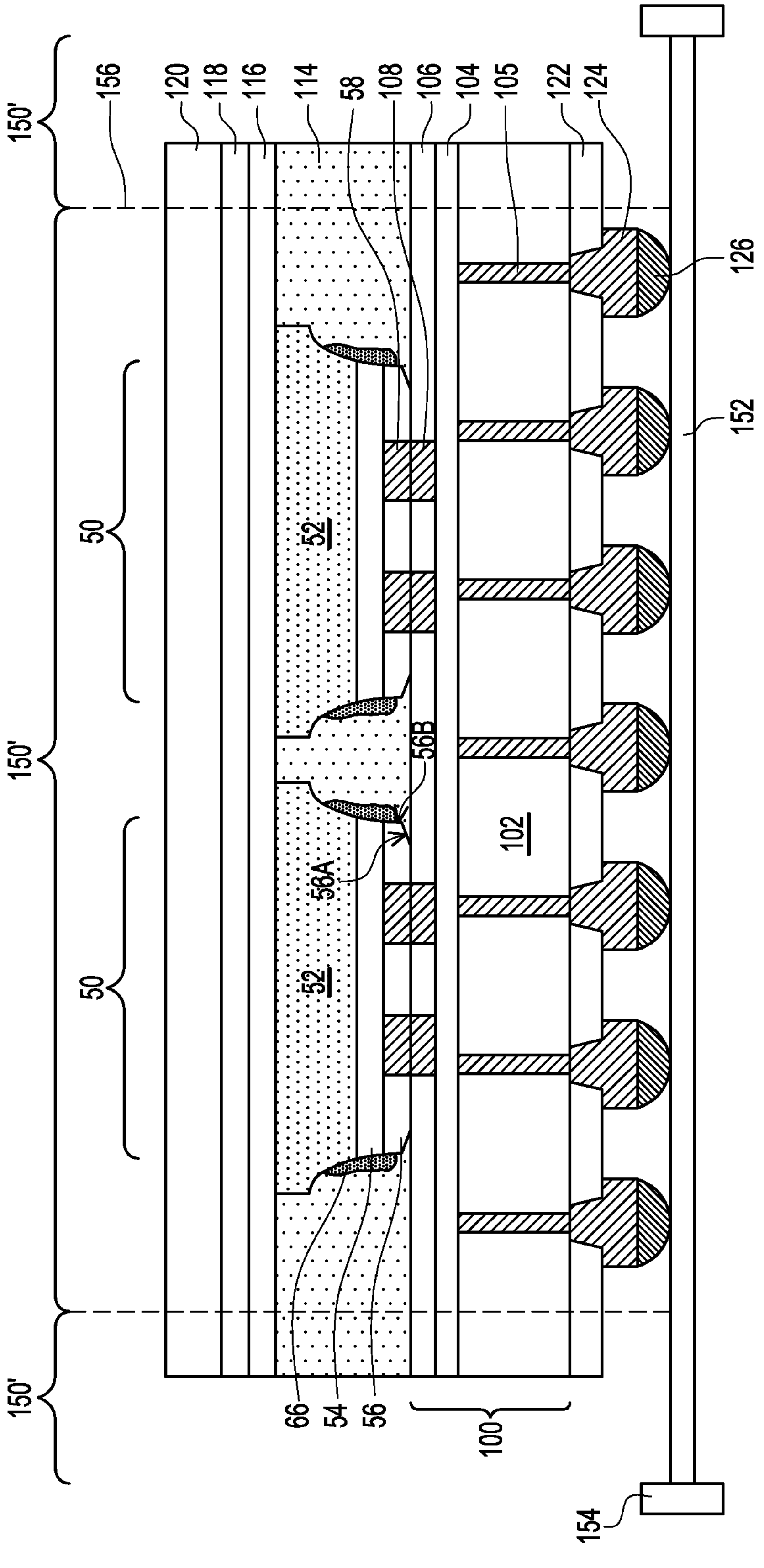

In FIG. 10, a dielectric layer 122 is formed on the back sides of the bottom integrated circuit die 100, under-bump metallizations (UBMs) 124 are formed through the dielectric layer 122, and electrical connectors 126 are formed on the UBMs 124. In some embodiments, the dielectric layer 122 comprises PBO, polyimide, a BCB-based polymer, or the like, and is formed by a suitable coating process such as spin coating, lamination, or the like. In some embodiments, the dielectric layer 122 comprises silicon dioxide, silicon nitride, or the like, and is formed by a suitable deposition process such as CVD, ALD, or the like. A redistribution structure (not separately illustrated) may be formed prior to forming the dielectric layer 122 to provide additional routing. The UBMs 124 may have portions extending along a surface of the dielectric layer 122 and portions extending through the dielectric layer 122 to physically and electrically couple to the conductive vias 105. As a result, the UBMs 124 are electrically coupled to the bottom integrated circuit die 100 and/or the top integrated circuit dies 50.

As an example to form the UBMs 124, the dielectric layer 122 may be patterned to form openings exposing the underlying the conductive vias 105. The patterning may be done by an acceptable photolithography and etching processes, such as forming a mask then performing an anisotropic etching. The mask may be removed after the patterning. A seed layer (not separately illustrated) may be formed on the dielectric layer 122, in the openings through the dielectric layer 122, and on the exposed portions of the conductive vias 105. The seed layer may be a metal layer, which may be a single layer or a composite layer comprising a plurality of sub-layers formed of different materials. In some embodiments, the seed layer comprises a titanium layer and a copper layer over the titanium layer. The seed layer may be formed using a suitable deposition process, such as physical vapor deposition (PVD) or the like. A photoresist may then be formed and patterned on the seed layer. The photoresist may be formed by spin coating or the like and may be exposed to light for patterning. The pattern of the photoresist may correspond to the UBMs 124. The patterning may form openings through the photoresist to expose the seed layer. A conductive material may be formed in the openings of the photoresist and on the exposed portions of the seed layer. The conductive material may be formed by plating, such as electroless plating, electroplating, or the like. The conductive material may comprise a metal or a metal alloy, such as copper, titanium, tungsten, aluminum, the like, or combinations thereof. Then the photoresist and portions of the seed layer on which the conductive material is not formed may be removed. The photoresist may be removed by an acceptable ashing or stripping process, such as using an oxygen plasma or the like. Once the photoresist is removed, portions of the seed layer on which the conductive material is not formed may be removed by an acceptable etching process, such as by wet or dry etching. The remaining portions of the seed layer and conductive material may form the UBMs 124.

Electrical connectors 126 may be formed on the UBMs 124. The electrical connectors 126 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. In some embodiments, the electrical connectors 126 comprise a conductive material such as solder, copper, aluminum, gold, nickel, silver, palladium, tin, the like, or a combination thereof. The electrical connectors 126 may be formed by initially forming a layer of solder through evaporation, electroplating, printing, solder transfer, ball placement, or the like. Once the layer of solder has been formed on the structure, a reflow may be performed to shape the solder into the desired bump shapes. In some embodiments, the electrical connectors 126 comprise metal pillars, such as a copper pillar, formed by a sputtering, printing, electroplating, electroless plating, CVD, or the like, which are solder free and have substantially vertical sidewalls. A metal cap layer may be formed on top of the metal pillars. The metal cap layer may include nickel, tin, tin-lead, gold, silver, palladium, indium, nickel-palladium-gold, nickel-gold, the like, or a combination thereof, and may be formed by a plating process.

The processes discussed above may be performed using wafer-level processing. The carrier 120 may be a wafer and may include many structures (not separately illustrated) similar to the one illustrated in FIG. 10. As such, the structure shown in FIG. 10 may be referred to as a wafer structure 150 and may be singulated in a subsequent process. For example, in FIG. 11, the wafer structure 150 is singulated to form individual integrated circuit package component 150'. The wafer structure 150 may be placed on a tape 152 supported by a frame 154. The wafer structure 150 may then be singulated along scribe lines 156, so that the wafer structure 150 may be separated into discrete integrated circuit package components 150'. The singulation process may include a sawing process, a laser cutting process, or the like. A cleaning process or rinsing process may be performed after the singulation process.

Figure 12:
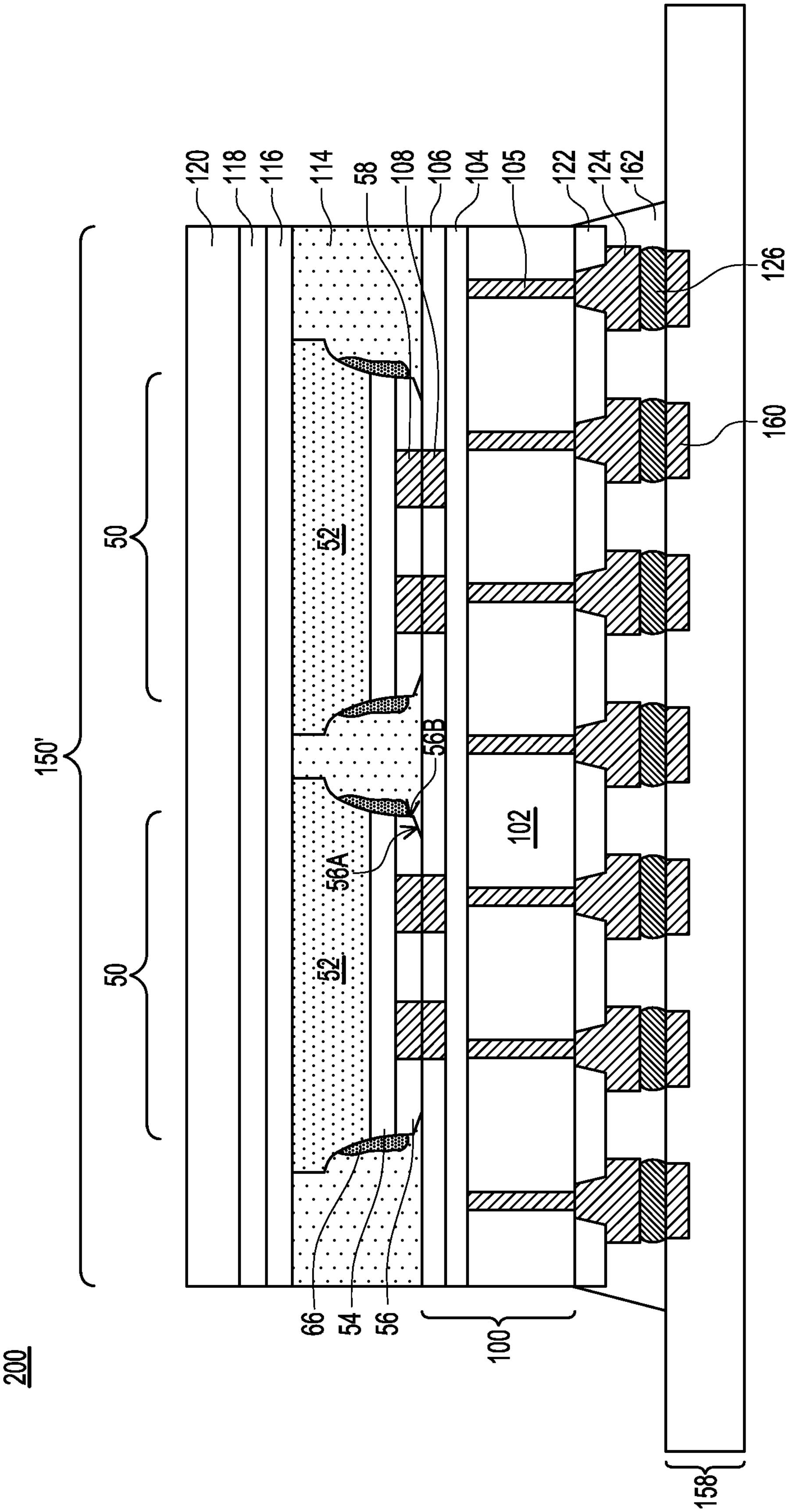

In FIG. 12, the integrated circuit package component 150' is bonded to a package substrate 158 and an underfill 162 is formed between the integrated circuit package component 150' and the package substrate 158. The package substrate 158 may include comprise bond pads 160. In some embodiments, the package substrate 158 comprise materials such as fiberglass reinforced resin, BT resin, other PCB materials, or the like. In some embodiments, the package substrate 158 comprise materials such as silicon, germanium, silicon germanium, silicon carbide, gallium arsenic, indium arsenide, indium phosphide, silicon germanium carbide, gallium arsenic phosphide, gallium indium phosphide, or the like.

The package substrate 158 may include active and/or passive devices (not separately illustrated), such as transistors, capacitors, resistors, combinations thereof, or the like. The devices may be formed using any suitable methods. The package substrate 158 may comprise metallization layers and vias (not separately illustrated) physically and electrically coupled to the bond pads 160. The metallization layers may be formed over the active and/or passive devices and may connect the various devices to form functional circuitry. The metallization layers may be formed in layers of dielectric material (e.g., low-k dielectric material) and conductive material (e.g., copper) with vias interconnecting the layers of conductive material. In some embodiments, the package substrate 158 is free of active and passive devices.

During the bonding process the electrical connectors 126 may be reflowed to bond the integrated circuit package component 150' to the bond pads 160. The electrical connectors 126 may electrically and physically couple the package substrate 158 to the integrated circuit package component 150'. In some embodiments, a solder resist (not separately illustrated) is formed on the package substrate 158. The electrical connectors 126 may be disposed in openings in the solder resist to electrically and physically couple to the bond pads 160. The solder resist may be used to protect areas of the package substrate 158 from external damage.

The underfill 162 may surround the electrical connectors 126 and protect the joints resulting from the reflowing of the electrical connectors 126. The underfill 162 may encircle the integrated circuit package component 150' in a top-down view. The underfill 162 may be formed by a capillary flow process after the integrated circuit package component 150' is attached or by a suitable deposition method before the integrated circuit package component 150' is attached. The underfill 162 may be subsequently cured. The structure shown in FIG. 12 may be referred to as the integrated circuit package 200.

FIGS. 13 through 16 are views of intermediate stages in the manufacturing of an integrated circuit package 202 (see FIG. 16), in accordance with some embodiments. The integrated circuit package 202 is similar to the integrated circuit package 200, wherein like numerals refer to like features. As will be discussed in greater detail below, the integrated circuit package 202 include top integrated circuit dies 50 that are singulated by a singulation process including an isotropic plasma etching. The structure illustrated in FIG. 13 assume processes similar to those discussed above with respect to FIGS. 1-3 were previously performed. Accordingly, after the grooves 64 and the recast regions 66 are formed by the laser ablation process as discussed above with respect to FIGS. 1-3, the manufacturing may proceed to FIG. 13, where the plasma etching process is applied to the wafer 10 to remove or reduce the recast regions 66 from the bonding surface, thereby allowing a subsequent bonding process with little or no hindrance from the recast regions 66. Furthermore, the second protective layer 62 and the first protective layer 60 are removed, and openings 68 are formed through the semiconductor substrate 52 by a dicing process.

Figure 13:
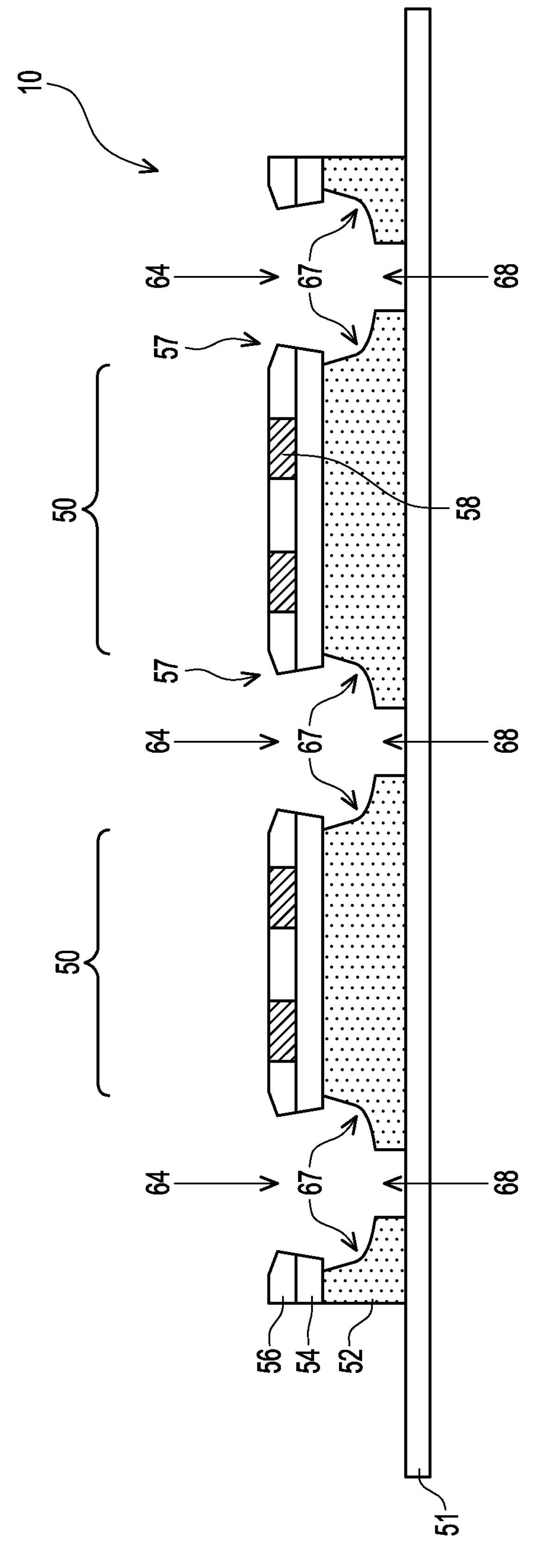

In the embodiment illustrated in FIG. 13, an isotropic plasma etching is applied and the recast regions 66 are removed. As a result, the sidewalls of the second protective layer 62, the first protective layer 60, the bonding layer 56, the interconnect structure 54, and the semiconductor substrate 52 are exposed. Additionally, the second protective layer 62, the first protective layer 60, the bonding layer 56, the interconnect structure 54, and the semiconductor substrate 52 may be further etched in the lateral directions. In some embodiments, the laser ablation process removes portions of the second protective layer 62 and the first protective layer 60 along the grooves 64, and the exposes portions of the top surface of the bonding layer 56 along the grooves 64. The isotropic plasma etching may remove the bonding layer 56 at a slower rate than the recast regions 66, which may lead to chamfered or rounded corners 57 on the bonding layer 56 along the grooves 64 as will be discussed in greater detail below. In some embodiments, the isotropic plasma etching removes the semiconductor substrate 52 at a faster rate than the interconnect structure 54 to recess a portion of the semiconductor substrate 52 from a sidewall of the interconnect structure 54 and a sidewall of the bonding layer 56, thereby forming recesses 67. As a result, the interconnect structure 54 and the bonding layer 56 may extend laterally beyond a sidewall of the semiconductor substrate 52.

The plasma used for the isotropic plasma etching process may be generated by a similar gas source described with respect to FIG. 4. In some embodiments, the plasma is generated by a radio frequency (RF) plasma generator, or the like, with a generation power in a range from about 0.1 kW to about 0.3 kW, such as about 0.2 kW. In some embodiments, the plasma may be generated by a microwave plasma generator, or the like, with a generation power in a range from about 1.5 kW to about 3 kW, such as about 2 kW.

Figure 14A:
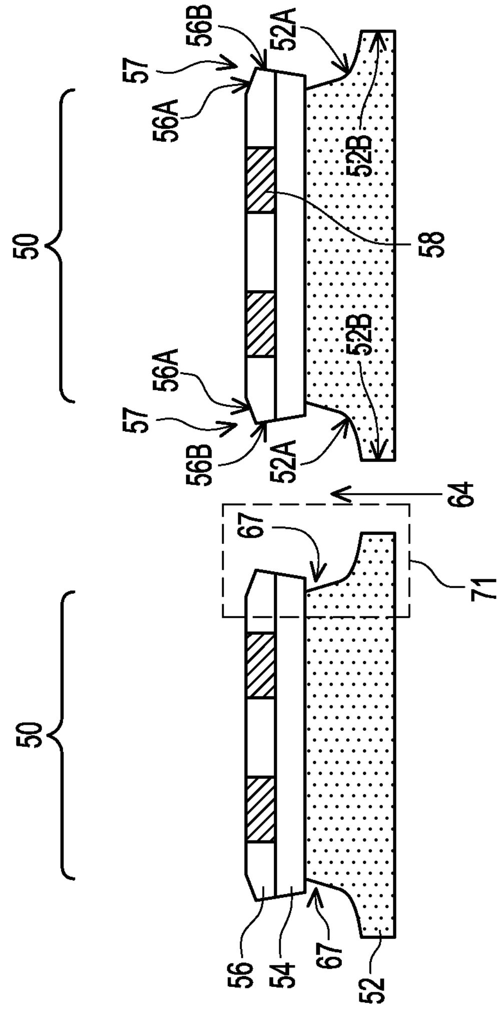
Figure 14B:
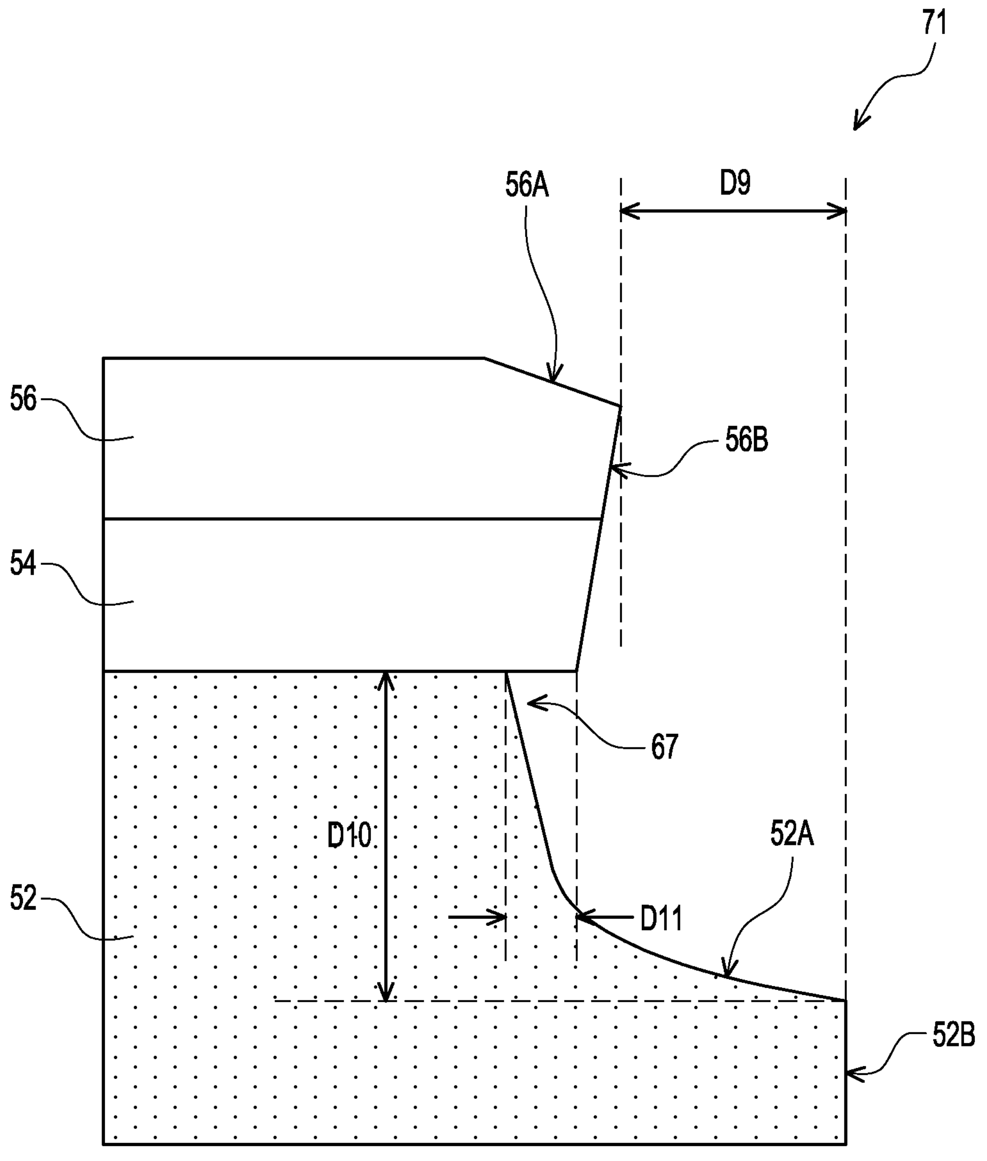

In FIG. 14A, the singulated top integrated circuit dies 50 are removed from the tape 51, wherein FIG. 14B shows an enlarged view of a region 71 of the top integrated circuit die 50 shown in FIG. 14A in accordance with some embodiments. As shown in FIGS. 14A and 14B, the bonding layer 56 along the grooves 64 may have chamfered or rounded corners 57 and may comprise upper sidewalls 56A and lower sidewalls 56B. The upper sidewalls 56A may be slanted towards the die connectors 58 and the lower sidewalls 56B may be slanted away from the die connectors 58. The upper portions of the semiconductor substrates 52 (e.g., portions of semiconductor substrates 52 near the interconnect structures 54) may have upper sidewalls 52A, which may be curved from as a result of the laser ablation process and/or the plasma etching process. Upper sidewalls 52A may be slanted towards the die connectors 58. The lower portions of the semiconductor substrates 52 (e.g., distal portions of semiconductor substrates 52 from the interconnect structures 54) may have lower sidewalls 52B, which may be substantially straight from the singulation process. The recesses 67 may be disposed between upper sidewalls 52A and a bottom surface of the interconnect structures 54, and lower portions of the semiconductor substrates 52 may laterally extend beyond the sidewalls of the interconnect structures 54.

Referring to FIG. 14B, a horizontal distance D9 between the lower sidewall 52B of the semiconductor substrate 52 and a junction of the upper sidewall 52A and the lower sidewall 56B of the bonding layer 56 may be in a range between about 2 μm to about 90 μm, such as about 45 μm. A vertical distance D10 between a top point and a bottom point of the upper sidewall 52A of the semiconductor substrate 52 (e.g., a thickness of the upper portion of the semiconductor substrate 52) may be in a range between about 1 μm to about 40 μm, such as about 20 μm. The recess 67 may have a width D11 in the horizontal direction, which may be in a range between about 1 μm to about 20 μm, such as about 10 μm.

Figure 15A:
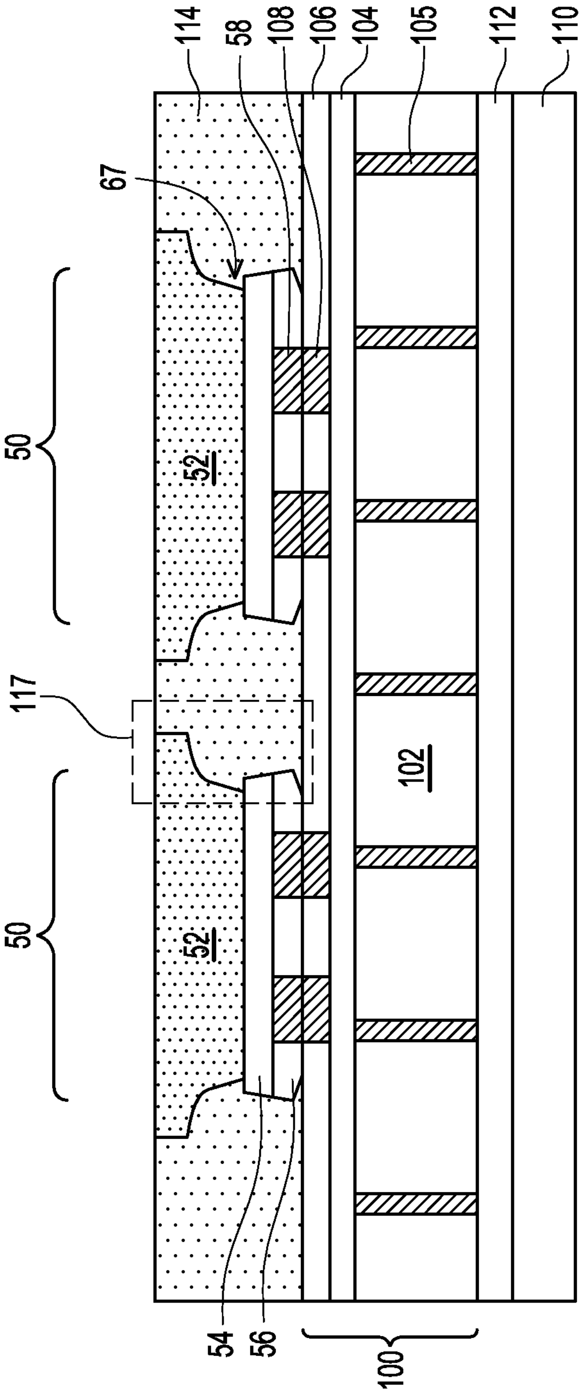
Figure 15B:
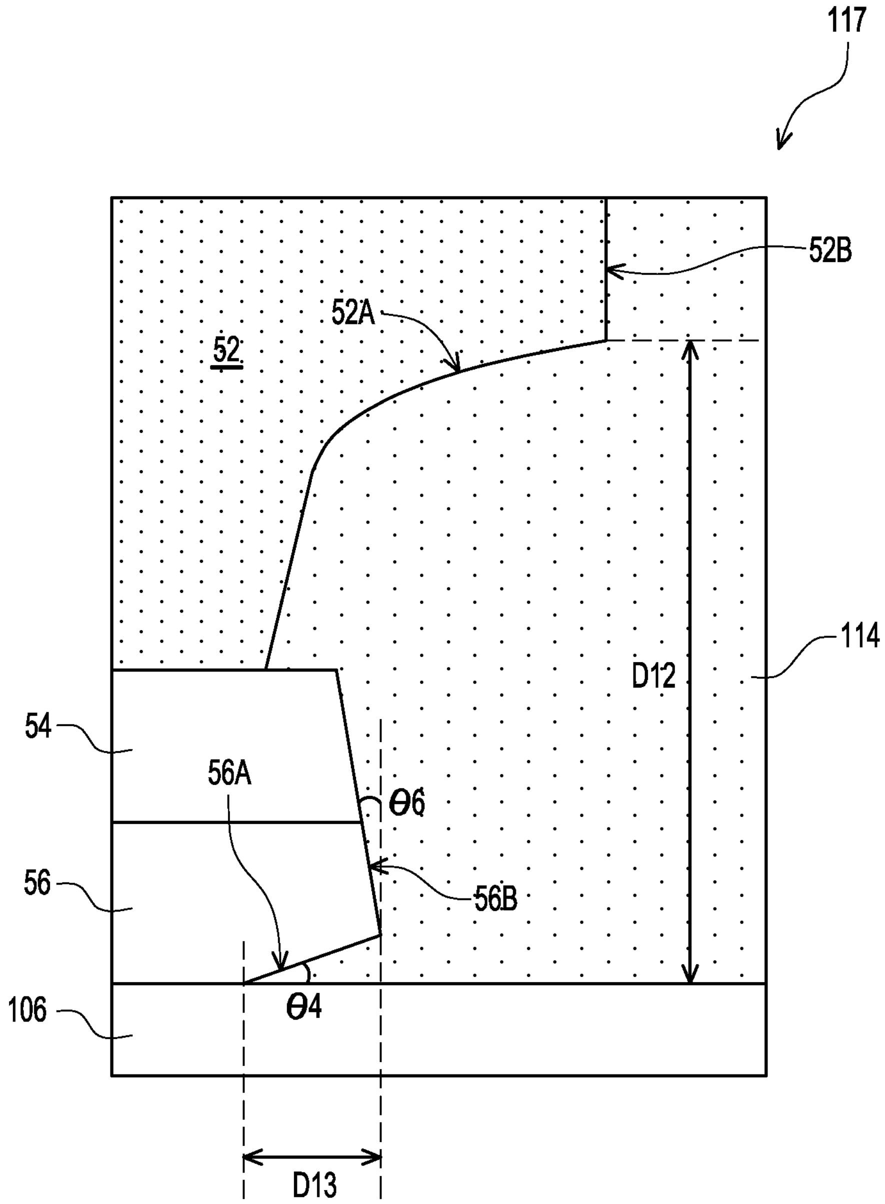

FIG. 15A illustrates the structure of FIG. 14A after performing processes similar to those described above with respect to FIGS. 7-8A to bond the top integrated circuit dies 50 to the bottom integrated circuit die 100, and form the gap-fill layer 114 around the top integrated circuit dies 50. FIG. 15B shows an enlarged view of a region 117 of the structure shown in FIG. 15A in accordance with some embodiments. As shown in 15A, the recesses 67 may be filled by the gap-fill layer 114, and the lower portions of the semiconductor substrates 52 (e.g., distal portions of semiconductor substrates 52 from the interconnect structures 54) may overhang the interconnect structures 54 and the bonding layers 56.

Referring to FIG. 15B, a vertical distance D12 between the bottom point of the upper sidewall 52A (see FIG. 14B) of the semiconductor substrate 52 and the top surface of the bonding layer 106 may be in a range between about 5 μm to about 60 μm, such as 30 μm. An intersection of the upper sidewall 56A of the bonding layer 56 and the top surface of the bonding layer 106 may form an acute angle θ4 in a range between 0° to about 30°, such as 15°. An intersection of the lower sidewall 56B of the bonding layer 56 and a line perpendicular to the top surface of the bonding layer 106 may form an acute angle θ6 a range between 0° to about 45°, such as about 20°. The space (e.g., recess) between the upper sidewall 56A and the top surface of the bonding layer 106 may be filled with the gap-fill layer 114. The portion of the gap-fill layer 114 that extend between the upper sidewall 56A and the top surface of the bonding layer 106 may have a width D13 in the horizontal direction in a range between about 1 μm to about 15 μm, such as about 8 μm.

Figure 16:
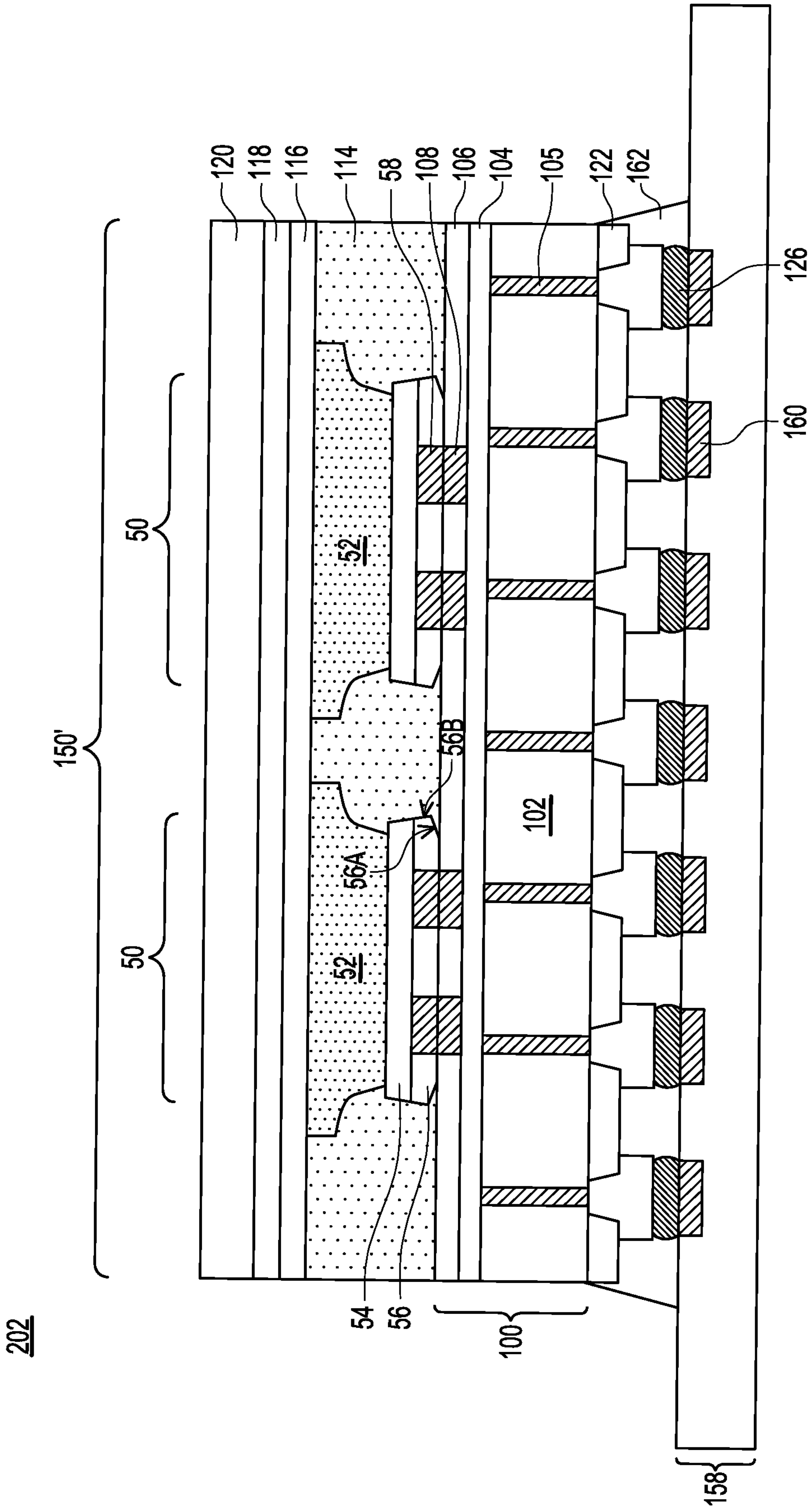

FIG. 16 illustrates the structure of FIG. 15A after performing processes similar to those discussed above with respect to FIGS. 9 through 12 to form or attach the carrier 120, the dielectric layer 122, the UBMs 124, and the electrical connectors 126, singulate the wafer structure 150 into the integrated circuit package component 150', bond the integrated circuit package component 150' to the package substrate 158, and form the underfill 162. The structure shown in FIG. 16 may be referred to as the integrated circuit package 202.

Various embodiments are described above in the context of a system on integrated chips (SoIC) package configuration. It should be understood that various embodiments may also be adapted to apply to other package configurations, such as integrated fan-out on substrate (InFO), chip on wafer on substrate (CoWoS) or the like.

The embodiments may have some advantageous features. By singulating the wafer 10 by a singulation method including a laser ablation process followed by a plasma etching process, a more effective bonding between the top integrated circuit dies 50 and the bottom integrated circuit die 100 may be achieved. As a result, defects at the bonding interface are reduced or prevented, thereby leading to an improved reliability of the integrated circuit packages 200 and 202.

In an embodiment, an integrated circuit package includes a first integrated circuit die including a first substrate; a first interconnect structure on a front side of the first substrate; and a first bonding layer on the first interconnect structure, the first interconnect structure being between the first bonding layer and the first substrate; an insulating layer along sidewalls of the first integrated circuit die; and a second integrated circuit die bonded to the first integrated circuit die, the second integrated circuit die including a second substrate; a second interconnect structure on a front side of the second substrate; and a second bonding layer on the second interconnect structure, the second interconnect structure being between the second bonding layer and the second substrate, wherein a first surface of the first bonding layer is in direct contact with a first surface of the second bonding layer, wherein a sidewall the first bonding layer and the first surface of the second bonding layer form a first acute angle. In an embodiment, the first acute angle is smaller than 30°. In an embodiment, a recast material is on a sidewall of the first substrate, a sidewall of the first interconnect structure, and a sidewall of the first bonding layer. In an embodiment, the recast material is spaced apart from the first surface of the second bonding layer. In an embodiment, the recast material comprises chemical elements of the first substrate, the first interconnect structure, and the first bonding layer. In an embodiment, a portion of the first substrate adjacent the front side of the first substrate is recessed from a sidewall of the first interconnect structure.

In an embodiment, an integrated circuit package includes a first integrated circuit die including: a first bonding layer; a first substrate; and a first interconnect structure between the first bonding layer and the first substrate, wherein the first interconnect structure comprises a first surface facing the first substrate; and an encapsulant along sidewalls of the first integrated circuit die, wherein the encapsulant contacts the first surface of the interconnect structure. In an embodiment, the first bonding layer extends laterally beyond a sidewall of the first substrate and wherein a distal portion of the first substrate overhangs the first bonding layer. In an embodiment, the first bonding layer comprises a sidewall adjacent to the first interconnect structure, wherein the first bonding layer comprises a second surface facing the first substrate, and wherein the sidewall of the first bonding layer and a line perpendicular to the second surface of the first bonding layer form a first acute angle. In an embodiment, the first acute angle is smaller than 45°. In an embodiment, the integrated circuit package further includes a second integrated circuit die, the second integrated circuit die including a second bonding layer in contact with the first bonding layer of the first integrated circuit die, wherein a sidewall of the first bonding layer intersects a surface of the second bonding layer to form a first acute angle. In an embodiment, the first acute angle is smaller than 30°.

In an embodiment, a method of forming an integrated circuit package includes forming one or more protective layers on a wafer; exposing the wafer to a laser beam, wherein the laser beam forms grooves in the wafer, and wherein after exposing the wafer to the laser beam recast regions are on sidewalls of the grooves; performing a plasma etching process, wherein the plasma etching process removes at least a portion of the recast regions on the sidewalls of the grooves; and dicing the wafer along the grooves to form a first integrated circuit die, wherein the first integrated circuit die comprises a first substrate, a first interconnect structure on the first substrate, and a first bonding layer on the first interconnect structure. In an embodiment, the plasma etching process performs an anisotropic etching on the wafer. In an embodiment, after performing the anisotropic etching, the recast regions are recessed below a top surface of the first bonding layer. In an embodiment, the plasma etching process performs an isotropic etching on the wafer. In an embodiment, after performing the isotropic etching, the recast regions are completely removed. In an embodiment, the isotropic etching forms a sidewall on the first bonding layer slanted in a first horizontal direction and forms a sidewall on the first substrate slanted in a second horizontal direction, the first horizontal direction being opposite to the second horizontal direction. In an embodiment, the method further includes bonding the first bonding layer of the first integrated circuit die to a second bonding layer of a second integrated circuit die; and forming a first gap-fill layer on the second integrated circuit die and along sidewalls of the first integrated circuit die, wherein the first gap-fill layer extends between the first bonding layer and the second bonding layer. In an embodiment, the first gap-fill layer extends between the first interconnect structure and the first substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit package comprising:

a first integrated circuit die comprising:

a first substrate;

a first interconnect structure on a front side of the first substrate; and a first bonding layer on the first interconnect structure, the first interconnect structure being between the first bonding layer and the first substrate;

an insulating layer along sidewalls of the first integrated circuit die; and a second integrated circuit die bonded to the first integrated circuit die, the second integrated circuit die comprising:

a second substrate;

a second interconnect structure on a front side of the second substrate; and a second bonding layer on the second interconnect structure, the second interconnect structure being between the second bonding layer and the second substrate, wherein a first surface of the first bonding layer is in direct contact with a first surface of the second bonding layer, wherein a sidewall of the first bonding layer and the first surface of the second bonding layer form a first acute angle, and wherein the first acute angle is smaller than 30°.

2. The integrated circuit package of claim 1, wherein a recast material is on a sidewall of the first substrate, a sidewall of the first interconnect structure, and a sidewall of the first bonding layer.

3. The integrated circuit package of claim 2, wherein the recast material is spaced apart from the first surface of the second bonding layer.

4. The integrated circuit package of claim 2, wherein the recast material comprises chemical elements of the first substrate, the first interconnect structure, and the first bonding layer.

5. The integrated circuit package of claim 1, wherein a portion of the first substrate adjacent the front side of the first substrate is recessed from a sidewall of the first interconnect structure.

6. An integrated circuit package comprising:

a first integrated circuit die comprising:

a first bonding layer;

a first substrate; and a first interconnect structure between the first bonding layer and the first substrate, wherein the first interconnect structure comprises a first surface facing the first substrate; and an encapsulant along sidewalls of the first integrated circuit die, wherein the encapsulant contacts the first surface of the first interconnect structure.

7. The integrated circuit package of claim 6, wherein the first bonding layer extends laterally beyond a sidewall of the first substrate and wherein a distal portion of the first substrate overhangs the first bonding layer.

8. The integrated circuit package of claim 6, wherein the first bonding layer comprises a sidewall adjacent to the first interconnect structure, wherein the first bonding layer comprises a second surface facing the first substrate, and wherein the sidewall of the first bonding layer and a line perpendicular to the second surface of the first bonding layer form a first acute angle.

9. The integrated circuit package of claim 8, wherein the first acute angle is smaller than 45°.

10. The integrated circuit package of claim 6, further comprising a second integrated circuit die, the second integrated circuit die comprising a second bonding layer in contact with the first bonding layer of the first integrated circuit die, wherein a sidewall of the first bonding layer intersects a surface of the second bonding layer to form a first acute angle.

11. The integrated circuit package of claim 10, wherein the first acute angle is smaller than 30°.

12. An integrated circuit package comprising:

a first integrated circuit die comprising:

a first substrate;

a first interconnect structure under the first substrate;

a first bonding layer under the first interconnect structure, wherein a first portion of the first substrate overhangs the first bonding layer; and a recast material on a sidewall of the first substrate, a sidewall of the first interconnect structure, and a sidewall of the first bonding layer;

an encapsulant encircling the first integrated circuit die; and a second integrated circuit die bonded to the first integrated circuit die, the second integrated circuit die comprising:

a second substrate;

a second interconnect structure over the second substrate; and a second bonding layer over the second interconnect structure, wherein a first surface of the first bonding layer is bonded to a first surface of the second bonding layer.

13. The integrated circuit package of claim 12, wherein a first sidewall of the first bonding layer and the first surface of the second bonding layer form a first acute angle.

14. The integrated circuit package of claim 12, wherein the encapsulant is between the first bonding layer and the second bonding layer.

15. The integrated circuit package of claim 12, wherein the recast material comprises chemical elements of the first substrate, the first interconnect structure, and the first bonding layer.

16. The integrated circuit package of claim 12, wherein the encapsulant is between the recast material and the second bonding layer.

17. The integrated circuit package of claim 12, wherein the first portion of the first substrate overhangs the recast material.

18. The integrated circuit package of claim 1, wherein a first portion of the first substrate overhangs the first bonding layer.

19. The integrated circuit package of claim 13, wherein the first acute angle is smaller than 30°.

20. The integrated circuit package of claim 12, wherein the first interconnect structure is separated from the encapsulant by the recast material.

* * * * *